United States Patent
Kusahara et al.

(10) Patent No.: US 10,620,288 B2
(45) Date of Patent: Apr. 14, 2020

(54) MAGNETIC RESONANCE IMAGING APPARATUS

(71) Applicant: Toshiba Medical Systems Corporation, Otawara-shi (JP)

(72) Inventors: Hiroshi Kusahara, Utsunomiya (JP); Yutaka Machii, Nasushiobara (JP); Yuki Takai, Nasushiobara (JP)

(73) Assignee: Canon Medical Systems Corporation, Otawara-shi (JP)

( * ) Notice: Subject to any disclaimer, the term of this patent is extended or adjusted under 35 U.S.C. 154(b) by 440 days.

(21) Appl. No.: 15/415,400

(22) Filed: Jan. 25, 2017

(65) Prior Publication Data

US 2017/0212201 A1    Jul. 27, 2017

(30) Foreign Application Priority Data

Jan. 26, 2016   (JP) ................................ 2016-012308

(51) Int. Cl.
  *G01R 33/565* (2006.01)
  *G01R 33/483* (2006.01)
  *G01R 33/561* (2006.01)

(52) U.S. Cl.
  CPC ... *G01R 33/56545* (2013.01); *G01R 33/4835* (2013.01); *G01R 33/5616* (2013.01)

(58) Field of Classification Search
  CPC ............ G01R 33/4835; G01R 33/5616; G01R 33/56545
  See application file for complete search history.

(56) References Cited

U.S. PATENT DOCUMENTS

| 2015/0355303 A1 | 12/2015 | Kuhara |
| 2016/0109546 A1* | 4/2016 | Machii ............. G01R 33/56554 324/322 |

FOREIGN PATENT DOCUMENTS

| JP | 2001-327480 | 11/2001 |
| JP | 2003-339662 | 12/2003 |
| JP | 2004-329613 A | 11/2004 |
| JP | 2014-158535 | 9/2014 |
| JP | 2015-161 A | 1/2015 |

OTHER PUBLICATIONS

Japanese Office Action dated Nov. 5, 2019 in Patent Application No. 2016-012308, 3 pages.

* cited by examiner

*Primary Examiner* — Rishi R Patel
(74) *Attorney, Agent, or Firm* — Oblon, McClelland, Maier & Neustadt, L.L.P.

(57) ABSTRACT

According to one embodiment, a magnetic resonance imaging apparatus includes processing circuitry. The processing circuitry sets imaging parameters for each scan. The processing circuitry specifies the size of the object region in the phase encode direction from a first image. The first image acquired by using a pulse sequence different from EPI. The processing circuitry sets parameters in a field of view in the phase encode direction in a phase correction scan based on the specified size and the size of the field of view in the phase encode direction in a second scan. The phase correction scan is executed for acquiring phase correction information for the first image. The second scan is executed for acquiring a second image by using EPI.

11 Claims, 10 Drawing Sheets

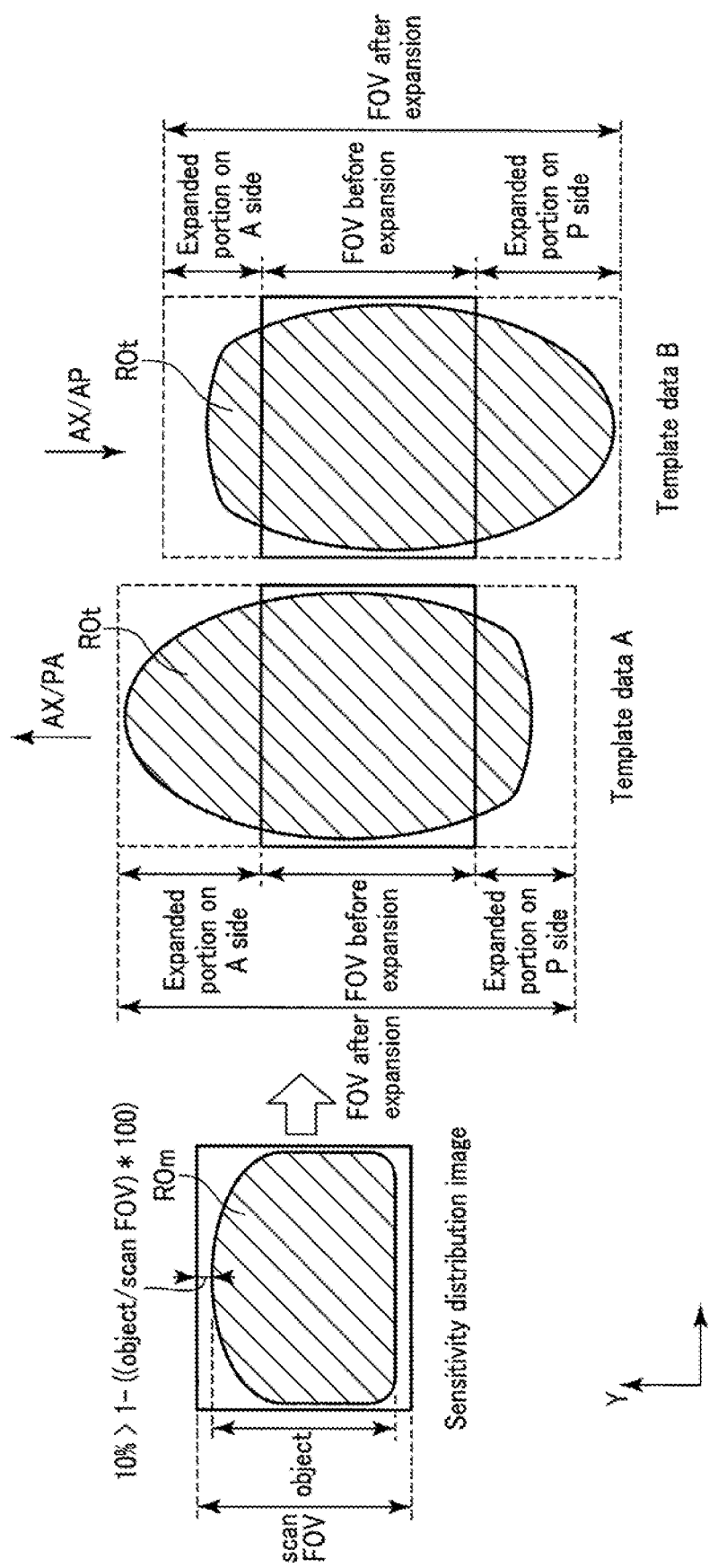
F I G. 7

Sensitivity distribution image

Template data C

Template D

Sensitivity distribution image

MAGNETIC RESONANCE IMAGING APPARATUS

CROSS-REFERENCE TO RELATED APPLICATIONS

This application is based upon and claims the benefit of priority from the prior Japanese Patent Application No. 2016-012308, filed Jan. 26, 2016 the entire contents of which are incorporated herein by reference.

FIELD

Embodiments described herein relate generally to a magnetic resonance imaging apparatus.

BACKGROUND

Magnetic resonance imaging is an imaging method in which nuclear spins inside an object placed in a static magnetic field are magnetically excited by RF signals having the Larmor frequency, and an image is reconstructed from MR signals generated upon the excitation.

One of the high-speed imaging methods in the field of magnetic resonance imaging is BPI (Echo Planar Imaging). EPI is designed to perform imaging while reversing a gradient magnetic field at high speed, and hence acquired echo data includes a phase error. Therefore, distortion occurs in an image reconstructed based on such echo data.

BRIEF DESCRIPTION OF THE DRAWING

FIG. 7 is a view showing an example of decision processing for an FOV stretch factor and an FOV stretch factor ratio based on an object size and a PE direction, which is performed in Application Example 4 of this embodiment;

DETAILED DESCRIPTION

A magnetic resonance imaging apparatus according to an embodiment includes processing circuitry, imaging control circuitry, and reconstruction circuitry. The processing circuitry sets imaging parameters for each scan. The imaging control circuitry executes a first scan for acquiring a first image including an object region by using a pulse sequence different from EPI in accordance with the imaging parameters, a second scan for acquiring a second image including the object region by using EPI, and a phase correction scan for acquiring phase correction information for the first image. The reconstruction circuitry generates the second image by using the phase correction information. The processing circuitry specifies the size of the object region in the phase encode direction from the first image, and sets parameters in a field of view in the phase encode direction in the phase correction scan based on the specified size and the size of the field of view in the phase encode direction in the second scan.

The magnetic resonance imaging apparatus according to this embodiment will be described below with reference to the accompanying drawing.

Figure 1:
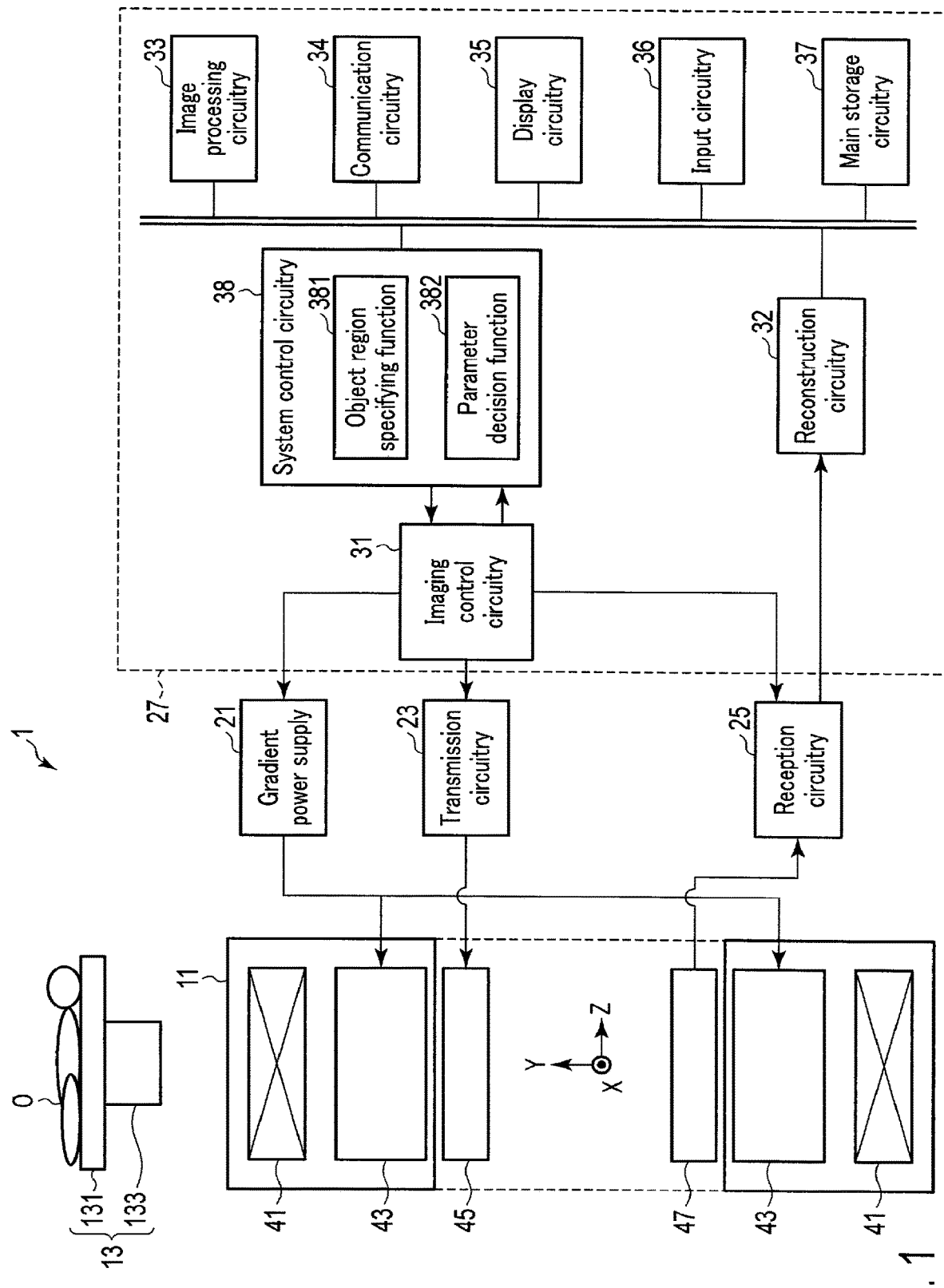
FIG. 1 is a block diagram showing the arrangement of a magnetic resonance imaging apparatus according to an embodiment.

FIG. 1 is a block diagram showing the arrangement of a magnetic resonance imaging apparatus 1 according to this embodiment. As shown in FIG. 1, the magnetic resonance imaging apparatus 1 includes a gantry 11, a couch 13, a gradient power supply 21, transmission circuitry 23, reception circuitry 25, and a host PC 27. The host PC 27 is a computer apparatus including imaging control circuitry 31, reconstruction circuitry 32, image processing circuitry 33, communication circuitry 34, display circuitry 35, input circuitry 36, main storage circuitry 37, and system control circuitry 38. The imaging control circuitry 31, the reconstruction circuitry 32, the image processing circuitry 33, the communication circuitry 34, the display circuitry 35, the input circuitry 36, the main storage circuitry 37, and the system control circuitry 38 are communicably connected to each other via a bus and the like. The gradient power supply 21, the transmission circuitry 23, and the reception circuitry 25 are provided separately from, for example, the host PC 27 and the gantry 11.

The gantry 11 includes a static field magnet 41 and a gradient coil 43. The static field magnet 41 and the gradient coil 43 are accommodated in the housing of the gantry 11.

A bore having a hollow shape is formed in the housing of the gantry 11. A transmission coil 45 and a reception coil 47 are arranged in the bore of the gantry 11.

The static field magnet 41 has a hollow, almost cylindrical shape, and generates a static magnetic field inside the almost cylindrical body. As the static field magnet 41, for example, a permanent magnet, superconducting magnet, or normal conducting magnet is used. In this case, the central axis of the static field magnet 41 is defined as the Z-axis. An axis vertically perpendicular to the Z-axis is called the Y-axis, and an axis horizontally perpendicular to the Z-axis is called the X-axis. The X-, Y-, and Z-axes constitute an orthogonal three-dimensional coordinate system.

The gradient coil 43 is a coil unit mounted inside the static field magnet 41 and formed in a hollow, almost cylindrical shape. The gradient coil 43 forms a gradient magnetic field upon reception of a current supplied from the gradient power supply 21. More specifically, the gradient coil 43 includes three coils corresponding to the X-, Y-, and z-axes which are perpendicular to each other. The three coils form gradient magnetic fields whose magnetic field intensities change along the X-, Y-, and Z-axes. Gradient magnetic fields along the X-, Y-, and Z-axes are combined to form a slice selection gradient magnetic field Gs, a phase encoding gradient magnetic field Ge, and a readout gradient magnetic field Gr, which are perpendicular to each other, in desired directions. These gradient magnetic fields are superimposed on a static magnetic field and applied to an object O. The slice selection gradient magnetic field Gs is used to arbitrarily determine an imaging slice. The phase encoding gradient magnetic field Ge is used to change the phase of an MR signal in accordance with a spatial position. The readout gradient magnetic field Gr is used to change the frequency of an MR signal in accordance with a spatial position. Assume that in the following description, the gradient direction of the slice selection gradient magnetic field Gs is the Z-axis, the gradient direction of the phase encoding gradient magnetic field Ge is the Y-axis, and the gradient direction of the readout gradient magnetic field Gr is the X-axis.

The gradient power supply 21 supplies a current to the gradient coil 43 in accordance with a sequence control signal from the imaging control circuitry 31. The gradient power supply 21 supplies a current to the gradient coil 43 to cause it to generate gradient magnetic fields in the X-, Y-, and Z-axis directions. These gradient magnetic fields are superimposed on the static magnetic field formed by the static field magnet 41 and applied to the object O.

The transmission coil 45 is arranged-inside the gradient coil 43 and generates a high-frequency magnetic field upon reception of an RF pulse from the transmission circuitry 23.

The reception coil 47 receives a magnetic resonance signal (to be referred to as an MR signal hereinafter) generated from a target nucleus in the object O upon reception of the effect of a high-frequency magnetic field. The reception coil 47 includes a plurality of reception coil elements which can receive MR signals. Each received MR signal is supplied to the reception circuitry 25 wiredly or wirelessly.

Note that the transmission coil 45 and the reception coil 47 each are only an example. A transmission/reception coil having a transmission function and a reception function may be used. Alternatively, the transmission coil 45, the reception coil 47, and the transmission/reception coil may be combined.

Although not shown in FIG. 1, the reception coil 47 has a plurality of reception channels implemented in parallel. Each reception channel includes a reception coil element which receives an MR signal and an amplifier which amplifies the MR signal. An MR signal is output for each reception channel. The total number of reception channels may be equal to or more or less than that of reception coil elements.

The transmission circuitry 23 transmits a high-frequency magnetic field for exciting a target nucleus in the object to the object O via the transmission coil 45. A target nucleus is typically a proton. More specifically, the transmission circuitry 23 supplies a high-frequency signal (RF signal) for exciting a target nucleus to the transmission coil 45 under the control of the imaging control circuitry 31. A high-frequency magnetic field generated from the transmission coil 45 vibrates at a resonance frequency unique to the target nucleus and excites the target nucleus. An MR signal is generated from the excited target nucleus and detected by the reception coil 47. The detected MR signal is supplied to the reception circuitry 25.

The reception circuitry 25 receives the MR signal generated from the excited target nucleus via the reception coil 47. The reception circuitry 25 generates a digital MR signal by processing the received MR signal. The digital MR signal is called echo data. The echo data is supplied to the reconstruction circuitry 32 wiredly or wirelessly.

The couch 13 is set adjacent to the gantry 11. The couch 13 includes a top plate 131 and a base 133. The object O is placed on the top plate 131. The base 133 supports the top plate 131 so as to make it slidable along each of the X-, Y-, and Z-axes. A couch driving device (not shown) is accommodated in the base 133. The couch driving device moves the top plate 131 under the control of the system control circuitry 38. As the couch driving device, for example, any type of motor such as a servo motor or stepping motor may be used.

The imaging control circuitry 31 includes, as hardware resources, a processor such as a CPU (Central Processing Unit) or MPU (Micro Processing Unit) and memories such as a ROM (Read Only Memory) and a RAM (Random Access Memory). The imaging control circuitry 31 synchronously controls the gradient power supply 21, the transmission circuitry 23, and the reception circuitry 25 based on pulse sequence information supplied from the system control circuitry 38, and obtains an image of the object O in the pulse sequence in accordance with the pulse sequence information.

The reconstruction circuitry 32 includes, as hardware resources, a processor such as a CPU, GPU (Graphical Processing Unit), or MPU and memories such as a ROM and a RAM. The reconstruction circuitry 32 reconstructs an MR image associated with the object O based on echo data from the reception circuitry 25. For example, the reconstruction circuitry 32 reconstructs an MR image by executing a two-dimensional Fourier transform (2DFT) on echo data concerning the phase encode axis and the frequency encode axis. Note that the reconstruction circuitry 32 may be implemented by an ASIC (Application Specific Integrated Circuit), an FPGA (Field Programmable Gate Array), a CPLD (Complex Programmable Logic Device), or an SPLD (Simple Programmable Logic Device), each of which implements a reconstruction function.

The image processing circuitry 33 includes, as hardware resources, a processor such as a CPU, GPU, or MPU and memories such as a ROM and a RAM. The image processing circuitry 33 performs various types of image processing for an MR image reconstructed by the reconstruction circuitry 32. Note that the image processing circuitry 33 may be implemented by an ASIC, FPGA, CPLD, or SPLD, each of which implements the above image processing function.

The communication circuitry 34 performs data communication with an external apparatus such as a PACS server connected via a network (not shown) or the like.

The display circuitry 35 displays various types of information. For example, the display circuitry 35 displays an MR image reconstructed by the reconstruction circuitry 32 and an MR image having undergone image processing by the image processing circuitry 33. More specifically, the display circuitry 35 includes display interface circuitry and a display device. The display interface circuitry converts data representing a display target into a video signal. A display signal is supplied to the display device. The display device displays a video signal representing a display target. As the display device, for example, there can be used a CRT display, liquid crystal display, organic EL display, LED display, or plasma display, or another arbitrary display known in this technical field.

The input circuitry 36 specifically includes an input device and input interface circuitry. The input device receives various types of commands from the user. As input devices, a keyboard, a mouse, various types of switches, and the like can be used. The input interface circuitry supplies an output signal from the input device to the system control circuitry 38 via a bus. Note that the input circuitry 36 is not limited to the one which includes physical operation components such as a mouse and a keyboard. For example, the input circuitry 36 includes electrical signal processing circuitry which receives electrical signals corresponding to input operations from an external input device provided separately from the magnetic resonance imaging apparatus 1, and outputs the received electrical signals to various types of circuits.

The main storage circuitry 37 is a storage device such as an HDD (Hard Disk Drive), SSD (Solid State Drive), or integrated circuit storage device, which stores various types of information. The main storage circuitry 37 may be a driving device or the like which reads and writes various types of information from and in a portable storage medium such as a CD-ROM drive, DVD drive, or flash memory. For example, the main storage circuitry 37 stores MR images and control programs and the like for the magnetic resonance imaging apparatus 1.

The system control circuitry 38 includes, as hardware resources, a processor such as a CPU or MPU and memories such as a ROM and a RAM. The system control circuitry 38 functions as the main unit of the magnetic resonance imaging apparatus 1. More specifically, the system control circuitry 38 reads out control programs stored in the main storage circuitry 37 and loads the programs in the memory. The system control circuitry 38 then controls the respective units of the magnetic resonance imaging apparatus 1 in accordance with the loaded control programs. The system control circuitry 38 implements an object region specifying function 381 and a parameter decision function 382 by executing the control programs.

The system control circuitry 38 specifies the size of an object region, in the phase encode direction, which is included in an image (to be referred to as a pre-image hereinafter) acquired by a pre-scan using a pulse sequence different from EPI by executing the object region specifying function 381. The phase encode direction will be referred to as the PE direction hereinafter. A pre-scan using a pulse sequence different from EPI includes, for example, a sensitivity distribution measurement scan for generating a sensitivity distribution image of the reception coil.

The system control circuitry 38 decides imaging conditions automatically or in accordance with an instruction from the user via the input circuitry 36 by executing the parameter decision function 382. In this embodiment, the system control circuitry 38 decides parameters for a field of view (FOV) in the PE direction which is associated with a two-dimensional phase correction scan using EPI based on the size of an object region in the PE direction and the size of the FOV in the PE direction which is associated with a main scan using an EPI pulse sequence. A main scan is a scan for reconstructing an image used for an image diagnosis. A two-dimensional phase correction scan using EPI is a scan to be performed before a main scan using EPI and a scan for generating phase correction data used for two-dimensional phase correction of an image obtained by the main scan. A two-dimensional phase correction scan is called a template shot. A parameter for an FOV in the PE direction which is associated with a template shot is a parameter representing the size of the FOV in the PB direction. More specifically, such parameters include an FOV size and an FOV stretch factor. An FOV stretch factor is defined as the magnification of an FOV size in the PE direction in a template shot with respect to an FOV size in the PE direction in a main scan using EPI.

The operation of the magnetic resonance imaging apparatus 1 according to this embodiment will be described next.

Figure 2:
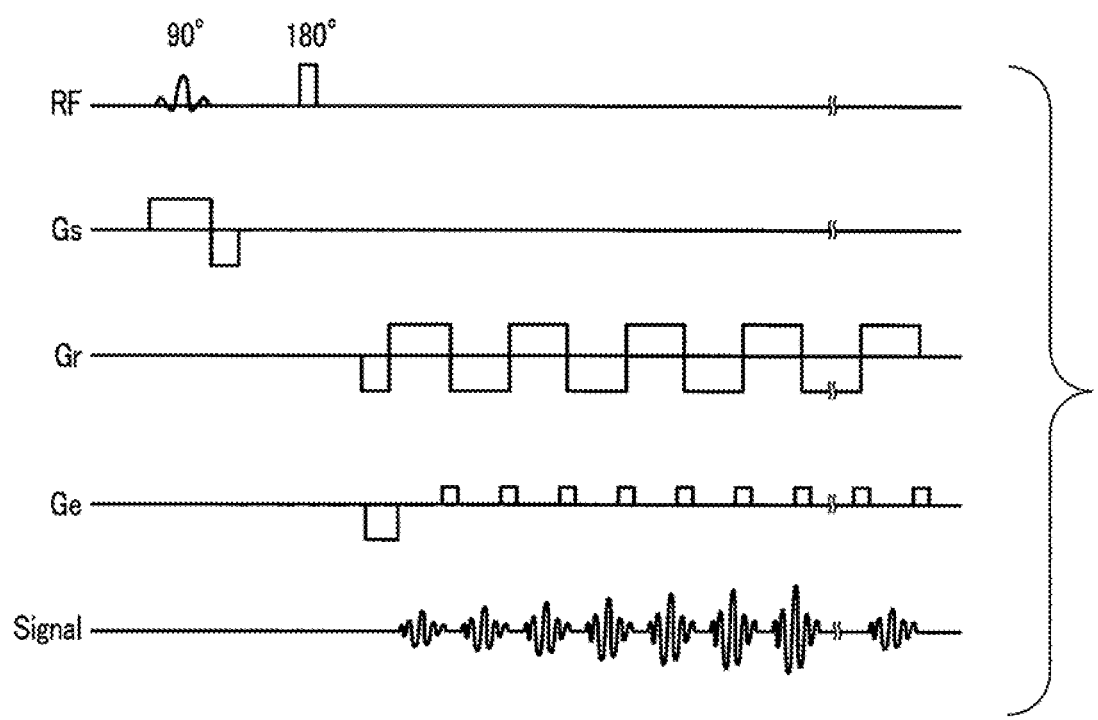
FIG. 2 is a timing chart showing an example of a pulse sequence for EPI executed by imaging control circuitry in FIG. 1.

FIG. 2 is a timing chart showing an example of a pulse sequence for EPI executed by the imaging control circuitry 31. In EPI, a gradient magnetic field is continuously reversed at high speed with respect to one nucleus excitation to continuously generate echoes, thus performing a scan. More specifically, in EPI, an RO (ReadOut) gradient magnetic field is reversed at high speed in accordance with a PE (Phase Encode) step before magnetization in an x-y plane is attenuated and eliminated by transverse relaxation (T2 relaxation) after the application of a 90° excitation pulse, thereby generating continuous gradient echoes and acquiring all data necessary for image reconstruction. EPI includes SE_EPI using an SE (Spin Echo) method of acquiring spin echo signals generated after the application of a 90° excitation pulse and a 180° excitation pulse, FE_EPI using an FE (Field Echo) method of acquiring echo signals generated after the application of a 908 excitation pulse, and FFE_EPI using an FFE (Fast FE) method. EPI designed to generate one image data by combining echo train data obtained by consecutive application of an excitation pulse is called multi-shot EPI. In contrast to this, EPI designed to reconstruct an image by only one application of an excitation pulse is called SS (Single Shot) EPI. Although this embodiment will exemplify single shot EPI as EPI, the embodiment is not limited to this and can be applied to other types of EPI described above.

As shown in FIG. 2, the imaging control circuitry 31 synchronously controls the gradient power supply 21, the transmission circuitry 23, and the reception circuitry 25 to apply both a 90° excitation pulse and the slice selection gradient magnetic field Gs to selectively excite magnetism in a slice plane, and then applies a 180° excitation pulse after an elapse of a predetermined time. The imaging control circuitry 31 then synchronously controls the transmission circuitry 23 and the reception circuitry 25 to repeatedly apply the readout gradient magnetic field Gr in a direction parallel to the slice plane while reversing its polarity. At the same time, the imaging control circuitry 31 applies the phase encoding gradient magnetic field Ge in a direction parallel to the slice selection gradient magnetic field Gs and perpendicular to the readout gradient magnetic field Gr. The imaging control circuitry 31 continuously generates a plurality of MR signals by repeatedly applying the readout gradient magnetic field Gr in this manner within a time during which transverse magnetization in the slice plane excited by the 90° excitation pulse is relaxed. The plurality of MR signals are received by the reception circuitry 25 and processed. The resultant signals are then output as echo data to the host PC 27.

In EPI, since imaging is performed while a gradient magnetic field is reversed at high speed, acquired echo data includes a phase error. Therefore, distortion occurs in a reconstructed image based on such echo data. It is considered that there are two main causes of a phase error in EPI, i.e., static magnetic field nonuniformity and a vortex magnetic field generated by gradient magnetic field switching. A phase error caused by the above static magnetic field nonuniformity varies depending on the signal intensity distribution of an imaging target and a static magnetic field nonuniformity spatial distribution in an imaging region. In contrast to this, a phase error caused by the above vortex magnetic field has a first-order gradient mainly in the readout direction in a real space, and the direction of the phase gradient is reverted depending on the polarity of the readout gradient magnetic field Gr during echo data acquisition.

As a method of reducing a phase error, two-dimensional phase correction using a template shot is used. Two-dimensional phase correction will be briefly described below.

In a template shot for two-dimensional phase correction, the imaging control circuitry 31 synchronously controls the gradient power supply 21, the transmission circuitry 23, and the reception circuitry 25 to acquire echo data via the reception circuitry 25. One set of echo data acquired by a template shot will be referred to as template data. Assume that a template shot for two-dimensional phase correction is the same EPI pulse sequence as that for a main scan. Upon acquiring echo data by a template shot, the reconstruction circuitry 32 separately extracts echo data corresponding to odd-numbered phase encode lines and echo data corresponding to even-numbered phase encode lines from the acquired echo data corresponding to a plurality of phase encode lines. A set of odd-numbered echo data arranged in a k-space is called odd-numbered template data. A set of even-numbered echo data arranged in the k-space is called even-numbered template data. The reconstruction circuitry 32 then generates a two-dimensional phase difference map by comparing the odd-numbered template data with the even-numbered template data for each phase encode line. The respective points in the phase difference map are assigned with a phase correction amounts for matching the phases of data included in the k-space. Applying this two-dimensional phase difference map to a reconstructed image obtained by a main scan will perform two-dimensional phase correction.

In the two-dimensional phase correction method, however, aliasing in the PE direction tends to occur due to insufficient size of template data for phase correction. This is because, since the acquisition time required by a template shot is longer than that required by a main scan using parallel imaging, many magnetic field nonuniformity components included in the acquired data enhance distortion. As a measure for eliminating aliasing, there may be used a method of unfolding aliased data in template data. It is, however, difficult to isolate the data of the aliased portion from the data of the original portion.

In order to eliminate aliasing in consideration of the above situation, the FOV size of template data in the PE direction is expanded. The magnification of an FOV in a template shot with respect to the FOV in a main scan is represented by a parameter called an FOV stretch factor. In addition, the amount of distortion in the PE direction depends on the size and shape of an object, the PE direction, an acquisition time, and the like. For this reason, even if the FOV of template data (to be referred to as the template FOV hereinafter) is expanded by an FOV stretch factor, an object region including distortion may protrude from the template FOV depending on the size and shape of the object, the PE direction, an acquisition time, and the like. Two-dimensional phase correction cannot be accurately performed by using phase correction data based on such template data.

Figure 3:
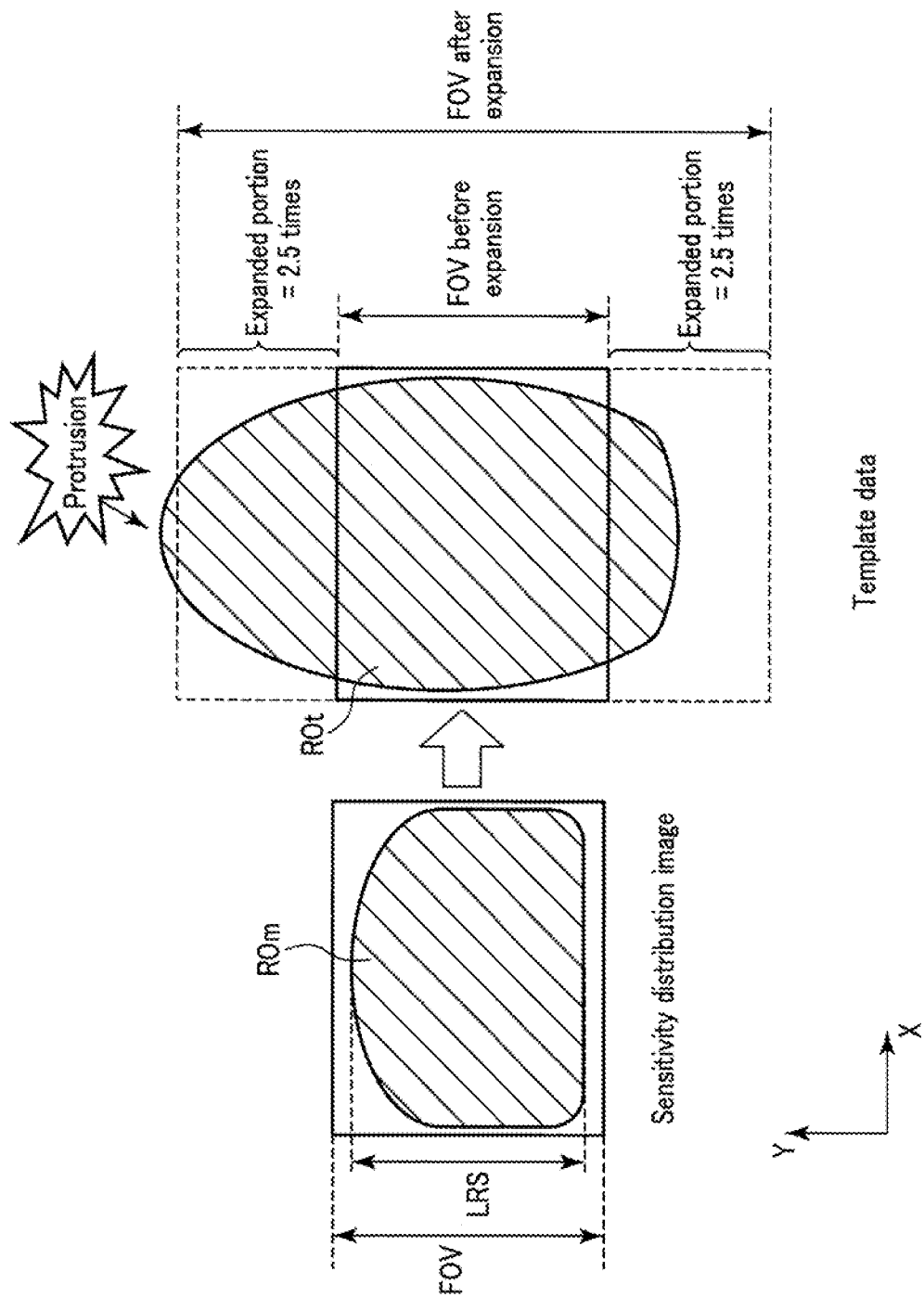
FIG. 3 is a view showing a portion of an object region which protrudes from template data due to the fact that an FOV stretch factor is a fixed value.

FIG. 3 is a view showing a portion of an object region which protrudes from template data due to the fact that an FOV stretch factor is a fixed value. The left side of FIG. 3 shows a sensitivity distribution image having an object region ROm. Note that a sensitivity distribution measurement scan uses no EPI pulse sequence, and hence no distortion occurs in the object region ROm included in the sensitivity distribution image and the object region ROm falls inside the sensitivity distribution image. In this case, a size LRS of the object region ROm in the PE direction is smaller than that of the FOV of the sensitivity distribution image. The right side of FIG. 3 shows template data having an object region ROt associated with the same object O. Since the template shot uses an EPI pulse sequence, distortion has occurred in the object region ROt included in the template data in the PE direction. As a consequence, the object region ROm greatly protrudes from the FOV before expansion. As described above, in order to eliminate distortion caused by a template shot, the template shot is performed with an FOV stretch factor as a fixed value of, for example, 2.5. If the FOV stretch factor is 2.5, the FOV size of the template data is set to 2.5 times the FOV size in EPI. Since the FOV stretch factor is set to 2.5, the FOV is expanded 2.5 times the FOV before expansion. With this operation, with regard to the expanded portion in the −Y direction, the object region ROm falls within the template FOV. However, with regard to the expanded portion in the +Y direction, the object region ROm still falls outside the template FOV. That is, as shown in FIG. 4, with large distortion, even if a template shot is performed with an FOV stretch factor as a fixed value of, for example, 2.5, the whole object region ROt including the distortion cannot be made to fall within the FOV after the expansion of the template data.

The system control circuitry 38 according to this embodiment therefore changes an FOV size in a template shot in the PE direction in accordance with the degree of distortion predicted to occur in the template shot.

Figure 4:
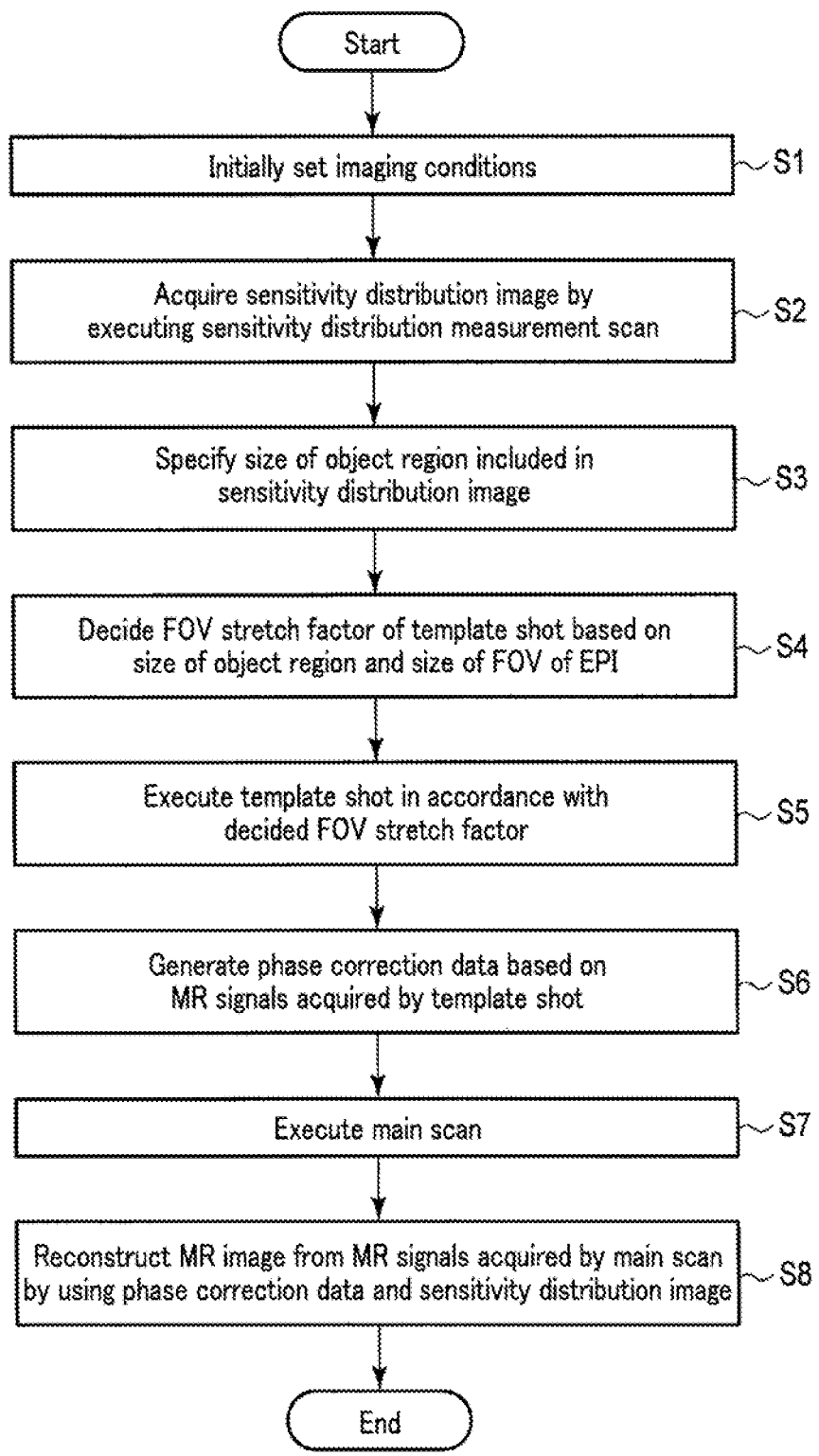
FIG. 4 is a flowchart showing a procedure for MR examination processing performed by system control circuitry in FIG. 1.

FIG. 4 is a flowchart showing a procedure for MR examination processing performed by the system control circuitry 38 according to this embodiment. As shown in FIG. 4, first of all, the system control circuitry 38 executes the parameter decision function 382 (step S1). In step S1, the system control circuitry 38 initially sets imaging conditions. Imaging conditions are set on an imaging condition editing screen displayed by the display circuitry 35. Initially set imaging conditions include the types and order of a plurality of scans constituting an MR examination. Note that a scan is sometimes called a protocol. Other imaging conditions include, for example, imaging parameters such as an FOV size and a matrix size in each scan. FOV sizes and matrix sizes may be individually set for the respective directions, i.e., the frequency encode direction (X-axis direction), the phase encode direction (Y-axis direction), and the slice direction (Z-axis direction) or may be collectively set to the same values. Note that when using an EPI pulse sequence, a matrix size in the frequency encode direction corresponds to the count of phase encode steps. As other imaging parameters, a phase encode direction in a real space, an acquisition time, and the like may be set. In parallel imaging, the acceleration factor of phase encode lines may be set as an imaging parameter.

For example, assume that in this embodiment, an MR examination includes a sensitivity distribution measurement scan, a template shot, and a main scan, which are performed in the order named. Assume that the scan type of a main scan is set to parallel imaging using an EPI pulse sequence. The acceleration factor of parallel imaging may be set to an arbitrary value. Assume that the scan type of a template shot is the same pulse sequence as that of the main scan, i.e., an EPI pulse sequence. Note that a template shot does not use parallel imaging, as described above. That is, the acceleration factor of a template shot is 1. An FOV size in a template shot is set in accordance with the setting of an FOV size in a main scan. That is, an FOV size in a template shot is automatically set to a value obtained by multiplying an FOV size in a main scan by the initial value of an FOV stretch factor. The initial value of an FOV stretch factor can be any value. Assume, for example, that the initial value is 2.5 times.

Upon executing step S1, the system control circuitry 38 causes the imaging control circuitry 31 to execute a sensitivity distribution measurement scan (step S2). In step S2, the imaging control circuitry 31 synchronously controls the gradient power supply 21, the transmission circuitry 23, and the reception circuitry 25 to execute a sensitivity distribution measurement scan. Upon executing the sensitivity distribution scan, the reception circuitry 25 receives MR signals for the respective reception channels, and processes the MR signals, thus outputting echo data. The reconstruction circuitry 32 generates sensitivity distribution images for the respective reception channels based on the echo data output for the respective reception channels. Since a sensitivity distribution measurement scan uses a pulse sequence different from EPI, distortion caused by a vortex current does not occur in a sensitivity distribution image obtained by the sensitivity distribution measurement scan. The main storage circuitry 37 stores a sensitivity distribution image for each reception channel.

Upon execution step S2, the system control circuitry 38 executes the object region specifying function 381 (step S3). In step S3, the system control circuitry 38 specifies the size of the object region in the PE direction which is included in the sensitivity distribution image. For example, the system control circuitry 38 preferably measures the size of the object region based on the half-width, signal distribution, and the like of the signal values (pixel values) of the sensitivity distribution image for each PE direction. In addition, the system control circuitry 38 may extract the object region from the sensitivity distribution image and measure the size of the extracted object region in the PB direction. A method of extracting an object region may be any existing image processing method. The size of an object region may be specified in each of all sensitivity distribution images or in any specific sensitivity distribution image. Alternatively, the system control circuitry 38 may specify object region sizes in all or several sensitivity distribution images and decide the average value of the specified sizes as the size of the object region. The size of an object region will be referred to as an object size hereinafter.

Upon executing step S3, the system control circuitry 38 executes the parameter decision function 382 (step S4). In step S4, the system control circuitry 38 decides the FOV stretch factor of the template shot based on the object size specified in step S3 and an FOV size in a main scan. More specifically, the system control circuitry 38 decides an FOV stretch factor in accordance with the ratio between an object size and an FOV size in a main scan. For example, the system control circuitry 38 decides a larger value as an FOV stretch factor with an increase in the ratio of the object size to the FOV size in the main scan, and decides a smaller value as an FOV stretch factor with a decrease in the ratio. This ratio will be referred to as a size ratio hereinafter.

Figure 5:
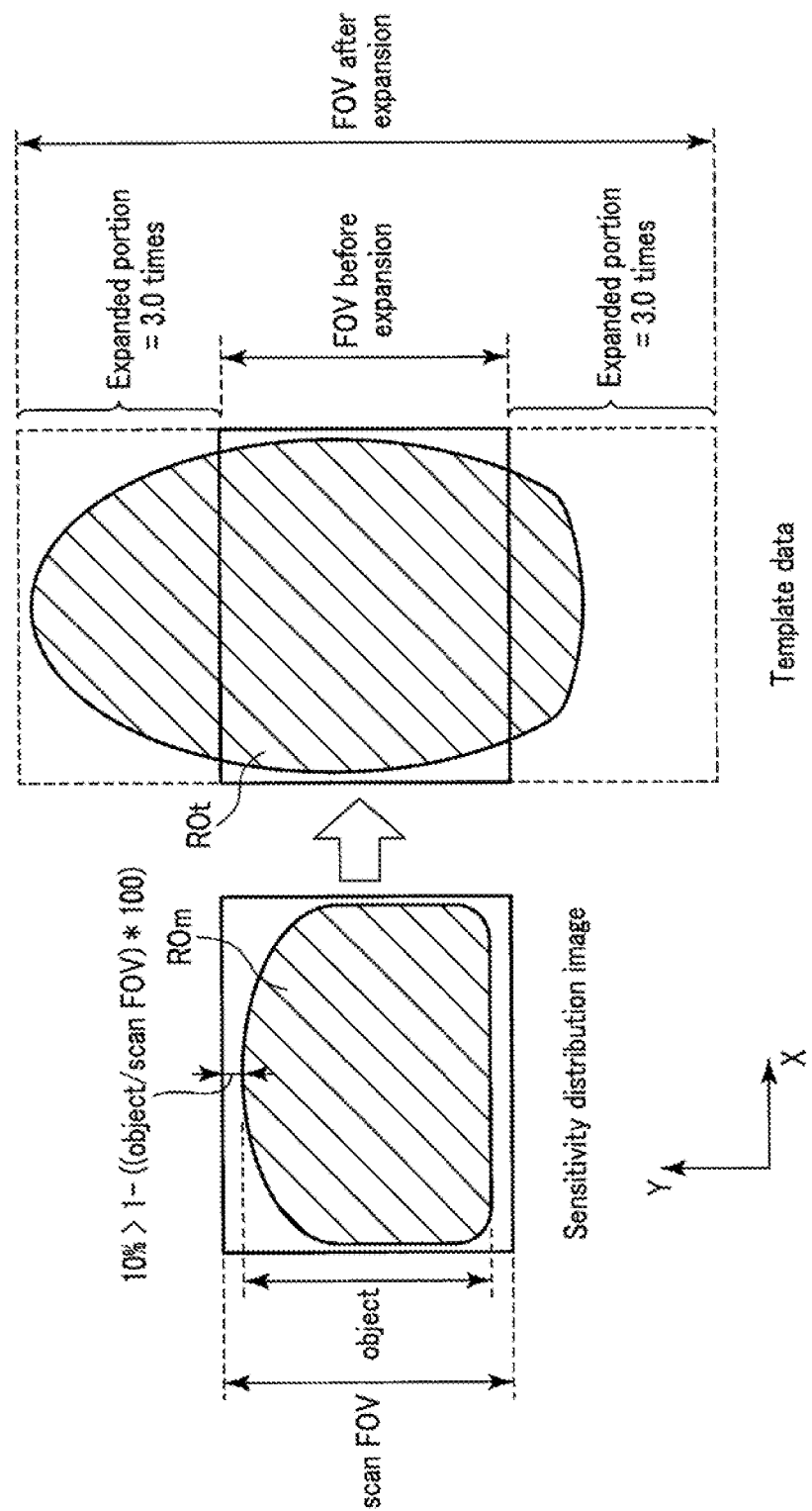
FIG. 5 is a view showing an example of decision processing for an FOV stretch factor which is performed in step S3 in FIG. 2.

FIG. 5 is a view showing an example of decision processing for an FOV stretch factor. As shown in FIG. 5, an FOV size in a sensitivity distribution measurement scan and an FOV size in a main scan in the PE direction are set to the same value. The FOV size in the main scan is equal to the FOV size of template data before expansion (FOV stretch factor=1). An FOV size in a sensitivity distribution scan, i.e., the ratio of an object size (object) to the FOV size in a main scan (scan FOV) is defined as (1−(object/scanFOV)*100) in percentage terms. Assume the size ratio is smaller than 10%. In this case, if an object size is approximate to an FOV size in a main scan as in a case in which, for example, the size ratio is smaller than 10%, the object region ROt may not fall within the FOV after expansion with initial value of FOV stretch factor=2.5. For this reason, if the object size (object) is close to the main scan FOV size (scanFOV), the system control circuitry 38 decides a value larger than the initial value as an FOV stretch factor, e.g., FOV stretch factor=3.0. Increasing the FOV stretch factor as compared with a normal magnification in this manner can make the object region ROt in the template data fall within the FOV after expansion.

Figure 6:
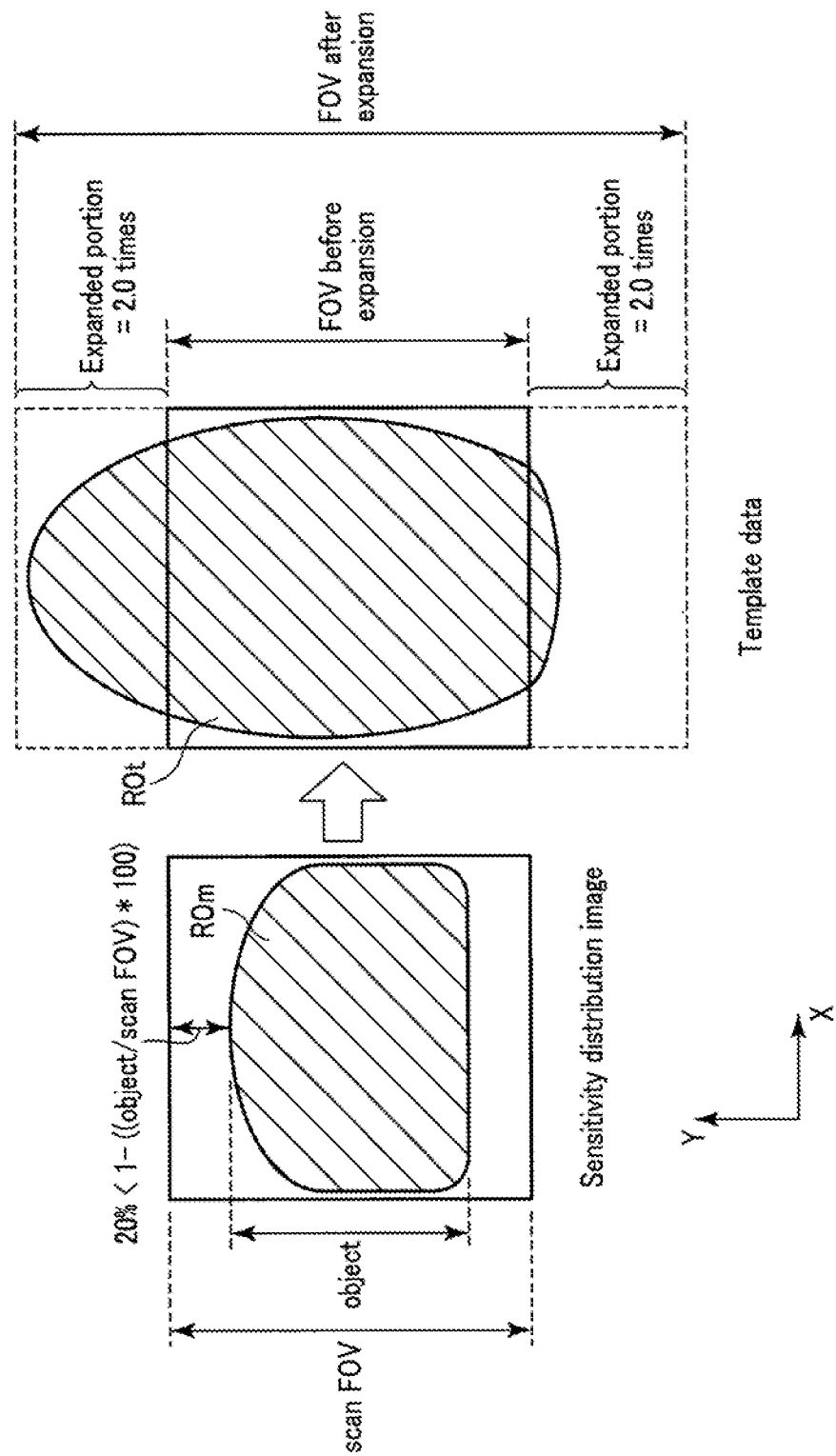
FIG. 6 is a view showing another example of decision processing for an FOV stretch factor which is performed in step S3 in FIG. 2.

FIG. 6 is another view showing another example of decision processing for an FOV stretch factor. As shown in FIG. 6, if the object size (object) is not close to the main scan FOV size (scanFOV) as in a case in which the size ratio is larger than 20%, the object region ROt is not likely to fall within the FOV after expansion with an initial value of 2.5 of an FOV stretch factor. However, the FOV is likely to be excessively larger than the object region ROt. For this reason, if the object size is not close to the main scan FOV size, the system control circuitry 38 decides a value smaller than the initial value as an FOV stretch factor, e.g., an FOV stretch factor of 2.0. This makes it possible to decide an FOV size suitable for an object size.

In order to decide an FOV stretch factor in accordance with a size ratio, the system control circuitry 38 preferably includes an LUT (Look Up Table) associating size ratios with FOV stretch factors. In this case, in step S4, the system control circuitry 38 calculates a size ratio based on the main scan FOV size and the object size, and decides an FOV stretch factor associated with the size ratio by searching the LUT using the size ratio as a search key. If an FOV stretch factor increases with a decrease in size ratio, the correspondence relationship between size ratios and FOV stretch factors can be arbitrarily set. For example, size ratios are preferably associated stepwise with FOV stretch factors such that the range of size ratios from 0% to 5% is associated with a magnification of 3.5, the range of size ratios from 5.5% to 10% is associated with an FOV stretch factor of 3.0, the range of size ratios from 10% to 15% is associated with an FOV stretch factor of 2.5, and the range of size ratios from 15% to 20% is associated with an FOV stretch factor of 2.0. In addition, size ratios may be linearly associated with FOV stretch factors.

Note that when an FOV is a three-dimensional volume, an FOV stretch factor may be decided for each slice, or a single FOV stretch factor may be decided for a three-dimensional volume.

When an FOV stretch factor is decided by the above method, the system control circuitry 38 preferably confirms an FOV stretch factor upon the reception of a confirmation instruction from the user via the input circuitry 36. In this case, the system control circuitry 38 preferably receives a correction instruction from the user via the input circuitry 36. When, for example, the user designates a value of an FOV stretch factor, a correction instruction is preferably issued to make the system control circuitry 38 confirm the designated value as an FOV stretch factor. Note that the system control circuitry 38 may confirm an FOV stretch factor without waiting for any confirmation instruction.

Upon executing step S4, the system control circuitry 38 causes the imaging control circuitry 31 to execute a template shot (step S5). In step S5, the imaging control circuitry 31 synchronously controls the gradient power supply 21, the transmission circuitry 23, and the reception circuitry 25 to execute a template shot using an EPI pulse sequence in accordance with the FOV stretch factor decided in step S5. FOV stretch factors correspond to the intensities of phase encode steps. The larger FOV stretch factors, the higher the intensities of phase encode steps, and the opposite is true.

Upon executing step S5, the system control circuitry 38 causes the reconstruction circuitry 32 to execute the processing of generating phase correction data (step S6). In step S6, the reconstruction circuitry 32 generates phase correction data representing the two-dimensional distribution of phase error components based on the echo data acquired by the template shot. That is, the reconstruction circuitry 32 separately extracts odd-numbered echo data and even-numbered echo data from the echo data acquired by the template shot, and compares the odd-numbered echo data and the even-numbered echo data for each phase encode line to generate phase correction data. Phase correction data is generated for each reception channel. The phase correction data generated for each reception channel is stored in the main storage circuitry 37.

Upon executing step S6, the system control circuitry 38 causes the imaging control circuitry 31 to execute a main scan (step S7). In step S7, the imaging control circuitry 31 executes the main scan by synchronously controlling the gradient power supply 21, the transmission circuitry 23, and the reception circuitry 25. Assume that a main scan according to this embodiment is parallel imaging using an EPI pulse sequence, as described above. In parallel imaging, the imaging control circuitry 31 executes an EPI pulse sequence upon thinning out phase encode steps in accordance with the number of reception channels constituting the reception coil 47.

Upon executing step S7, the reconstruction circuitry 32 generates an MR image without any phase error or aliasing from the MR signals acquired by the main scan (parallel imaging) by using the phase correction data generated in step S6 and the sensitivity distribution image generated in step S2 (step S8).

A method of generating an MR image without any phase error or aliasing will be described below. Assume that a set of echo data filling a k-space will be referred to as an echo data set. First of all, the reconstruction circuitry 32 performs two-dimensional phase correction by applying phase correction data to an echo data set within the same reception channel for each of a plurality of reception channels. The reconstruction circuitry 32 then separately extracts odd-numbered echo data and even-numbered echo data from the echo data set after the two-dimensional phase correction for each of the plurality of reception channels. The reconstruction circuitry 32 reconstructs an odd-numbered image by applying a two-dimensional Fourier transform to the odd-numbered echo data, and reconstructs an even-numbered image by applying a two-dimensional Fourier transform to the even-numbered echo data. The odd-numbered image suffers from aliasing caused by the thinning out of phase encode steps and the lack of the even-numbered echo data. The even-numbered image suffers from aliasing caused by the thinning out of phase encode steps and the lack of the odd-numbered echo data. The reconstruction circuitry 32 generates a single odd-numbered image without any aliasing by performing unfolding using a sensitivity distribution image and an odd-numbered image each corresponding to a plurality of reception channels. When, for example, parallel imaging is performed with PIF=2, the reconstruction circuitry 32 performs unfolding corresponding to PIF=4 with respect to the sensitivity distribution image and the odd-numbered image each corresponding to the plurality of reception channels. Likewise, the reconstruction circuitry 32 generates a single even-numbered image without any aliasing by performing unfolding using the even-numbered image. The reconstruction circuitry 32 combines the odd-numbered image without any aliasing with the even-numbered image without any aliasing. This generates an MR image without any phase error or aliasing. The display circuitry 35 displays the generated MR image.

This is the end of the description of typical processing for an MR examination performed by the system control circuitry 38 according to this embodiment.

Note that a procedure for the above MR examination processing is an example, and the MR examination in this embodiment is not limited to this. For example, a scan for active shimming, a positioning scan, and the like may be performed in addition to a sensitivity distribution measurement scan before a template shot.

In addition, in the above MR examination, imaging conditions for a sensitivity measurement scan, a template shot, and a main scan are uniformly set before the sensitivity distribution measurement scan. However, this embodiment is not limited to this. For example, imaging conditions for a template shot may be set before the template shot separately from imaging conditions for a main scan which are set before the main scan.

In the above MR examination, an FOV stretch factor is decided based on a pre-image acquired by a pre-scan such as a sensitivity distribution measurement scan. However, this embodiment is not limited to this. The system control circuitry 38 according to the embodiment may decide an FOV stretch factor based on any image as long as it is acquired by a scan using an pulse sequence other than an EPI pulse sequence. For example, when performing a plurality of main scans, the system control circuitry 38 can decide an FOV stretch factor based on an image acquired by a main scan (to be referred to as preceding main scan hereinafter) performed before a main scan for which the FOV stretch factor should be decided. A preceding main scan is temporally closer to a main scan for which an FOV stretch factor should be decided than a pre-scan, using an image acquired by the preceding main scan makes it possible to decide an FOV stretch factor more properly than using a pre-image. Note that when using an image acquired by a preceding main scan, the system control circuitry 38 may not perform a pre-scan.

In addition, the above embodiment is based on the assumption that a main scan is a scan targeted for a single slice. However, this embodiment is not limited to this. That is, the embodiment can be applied to a case in which a main scan is a multi-slice scan targeted for a plurality of slices. In this case, in step S4, the system control circuitry 38 decides an FOV stretch factor for each of a plurality of slices constituting a multi-scan. Obviously, different FOV stretch factors may be decided for the respective slices. In step S5, the imaging control circuitry 31 executes a template shot for each of a plurality of slices in accordance with an decided FOV stretch factor. In step S6, the reconstruction circuitry generates phase correction data for each of the plurality of slices. In step S7, the imaging control circuitry 31 executes a main scan using an EPI pulse sequence for each of a plurality of slices. In step S8, the reconstruction circuitry 32 reconstructs an MR image for each of the plurality of slices. As described above, applying this embodiment to a multi-slice scan can set a proper FOV in accordance with an object shape in each of all the slices constituting a multi-slice.

In the above case, an FOV stretch factor is decided in accordance with an object size. However, this embodiment is not limited to this. The system control circuitry 38 may decide an FOV stretch factor based on factors, other than an object size, which influence the degree and direction of distortion. Application examples of the method of deciding an FOV stretch factor will be described below.

Application Example 1

An acquisition time is a factor that influences the degree of distortion. An acquisition time is defined as the time taken to fill the k-spaces of all slices with phase encode lines. In a scan using an EPI pulse sequence, as the acquisition time prolongs, the nonuniformity of a magnetic field is accumulated, resulting in larger distortion in an object region. The magnetic resonance imaging apparatus 1 according to Application Example 1 will be described below.

The system control circuitry 38 according to Application Example 1 preferably decides based on an object size and an acquisition time. For example, it is preferable that the system control circuitry 38 initially decides an FOV stretch factor based on an object size in the above manner, and adjusts the initially decided FOV stretch factor in accordance with an acquisition time. If the size ratio remains the same but the acquisition time is longer than a standard time width, the FOV stretch factor is preferably increased by a specified expansion value. If the acquisition time is shorter than the standard time width, the FOV stretch factor is decreased by a specified contraction value. The user can arbitrarily set an expansion value and a contraction value via the input circuitry 36 or the like. In addition, an expansion value and a contraction value may be decided in accordance with how much the acquisition time deviates from the standard time width.

As described above, according to Application Example 1, when deciding an FOV stretch factor, it is possible to decide an FOV stretch factor more suitable to the actual amount of distortion by considering an acquisition time in addition to an object size than when deciding an FOV stretch factor based on only the object size.

Application Example 2

The shape of an object is another factor that influences the degree of distortion. A portion exhibiting a great change in spatial shape includes large distortion, whereas a portion exhibiting a moderate change in spatial shape includes small distortion. The magnetic resonance imaging apparatus 1 according to Application Example 2 will be described below.

The system control circuitry 38 according to Application Example 2 decides an FOV stretch factor based on an object size and an object shape. For example, it is preferable that the system control circuitry 38 initially decides an FOV stretch factor based on an object size in the above manner, and adjusts the initially decided FOV stretch factor in accordance with an object shape. More specifically, the system control circuitry 38 calculates a feature amount representing the geometrical shape of the object region by image processing in step S3 in FIG. 4. A feature amount representing a geometrical shape includes, for example, a circularity degree, the length, width, and direction of a major axis, and a moment. If a calculated feature amount is larger (or smaller) than a predetermined threshold range, the system control circuitry 38 preferably increases the FOV stretch factor by a specified expansion value. If the feature amount is smaller (or lager) than the threshold range, the system control circuitry 38 preferably decreases the FOV stretch factor by a specified contraction value. It is preferable to arbitrarily set a threshold range in accordance with the type of feature amount. The user can arbitrarily set an expansion value and a contraction value via the input circuitry or the like. In addition, an expansion value and a contraction value may be decided in accordance with how much a feature amount deviates from a threshold range.

Note that in the above case, a feature amount representing the geometrical shape of an object region is calculated. However, this embodiment is not limited to this. For example, the system control circuitry 38 may extract a portion protruding from an object region and calculate a feature amount representing the geometrical shape of the extracted protruding portion.

As described above, according to Application Example 2, when deciding an FOV stretch factor, it is possible to decide an FOV stretch factor more suitable to the actual amount of distortion by considering an object shape in addition to an object size than when deciding an FOV stretch factor based on only the object size.

Application Example 3

In Application Example 2, an object shape is specified from a sensitivity distribution image. However, this embodiment is not limited to this. The system control circuitry 38 according to Application Example 3 may specify an object shape from a shimming image based on MR signals acquired by a scan for active shimming. The magnetic resonance imaging apparatus 1 according to Application Example 3 will be described below.

A scan for active shimming is performed to measure a magnetic field distribution generated from a shim coil for correcting magnetic field distortion caused by an object. The shim coil is mounted in the static field magnet. The shim coil is connected to a shim coil power supply. The shim coil power supply supplies a current to the shim coil to cause it to generate a magnetic field having a predetermined distribution. Note that no EPI pulse sequence is used in a scan for active shimming.

In a scan for active shimming, the imaging control circuitry 31 acquires MR signals in a first echo time (TE) and a second echo time by synchronously controlling the shim coil power supply, the transmission circuitry 23, and the reception circuitry 25. The reconstruction circuitry 32 reconstructs shimming images based on MR signals in the first echo time and the second echo time. The reconstruction circuitry 32 generates a difference image between the shimming image associated with the first echo time and the shimming image associated with the second echo time. The generated difference image represents the spatial distribution of phase errors associated with the object which are accumulated in the time difference between the first echo time and the second echo time. Phase errors have larger values in portions exhibiting greater spatial changes in object shape. That is, the system control circuitry 38 can accurately specify the amount of distortion based on the shape of an object region and phase errors (pixel values) included in a difference image. For example, the system control circuitry 38 initially decides an FOV stretch factor based on the shape of an object region included in a difference image, and calculates the degree of change in object shape based on the phase error distribution of the object region. The system control circuitry 38 preferably increases an FOV stretch factor by a specified expansion value if the degree of change in object shape is larger than a standard value, and decreases the FOV stretch factor by a specified contraction value if the degree of change in object shape is smaller than the standard value.

As described above, the system control circuitry 38 according to Application Example 3 can specify an object shape based on shimming images. This makes it possible to accurately specify the amount of distortion and consequently decide an accurate FOV stretch factor as compared with a case in which an object shape is specified based on a sensitivity distribution image.

Application Example 4

The PE direction is a factor that influences the direction of distortion. An object distorts along the PE direction. Therefore, the system control circuitry 38 preferably decides an FOV stretch factor and an FOV stretch factor ratio based on an object size and the PE direction. The magnetic resonance imaging apparatus 1 according to Application Example 4 will be described below.

FIG. 7 is a view showing an example of decision processing for an FOV stretch factor and an FOV stretch factor ratio based on an object size and the PB direction. As shown in FIG. 7, assume that the object region has a shape which is flat on the back side (P side) of the object in the PE direction and protrudes on the front side (A side). When the PE direction is the PA direction, the object region ROt distorts so as to extend from A side to P side in template data A. Note that the PA direction is a direction extending from the back side (P side) of an object to the front side (A side). In contrast, when the PB direction is the AP direction, the object region ROt distorts so as to extend from P side to A side in template data B. Note that the AP direction is opposite to the PA direction, and extends from the front side (A side) of the object to the back side (P side).

As described above, since the distortion direction of the object region ROt depends on the PH direction, if the FOV stretch factor on P side is equal to that on A side, a vacant space is formed on the side where the amount of distortion is small. When, for example, the PB direction is the PA direction as in template data A, if the FOV stretch factor of an expanded portion on P side is equal to that of an expanded portion on A side, a vacant space is formed in the FOV at the expanded portion on A side.

The system control circuitry 38 preferably changes an FOV stretch factor ratio in accordance with the PB direction. An FOV stretch factor ratio is more specifically the ratio between an FOV stretch factor in the forward direction (an expanded portion on A side) of the PB direction and an FOV stretch factor in the reverse direction (an expanded portion on P side). In other words, an FOV stretch factor ratio is equal to the shift amount of an FOV after expansion with respect to an FOV before expansion in the PE direction.

For example, as shown in FIG. 7, if the PE direction is the PA direction and it is determined that the FOV stretch factor is increased because the size ratio is smaller than 10%, the system control circuitry 38 decides 3.0 as the FOV stretch factor of the expanded portion on A side and 2.0 as the FOV stretch factor of the expanded portion on P side. In other words, the system control circuitry 38 decides 2.5 as the overall FOV stretch factor, and shifts the FOV to P side by ¼ the FOV size before expansion so as to make the object region including distortion fall within the FOV.

The imaging control circuitry 31 executes a template shot by synchronously controlling the gradient power supply 21, the transmission circuitry 23, and the reception circuitry 25 in accordance with the decided FOV stretch factor and FOV stretch factor ratio. As described above, an FOV stretch factor corresponds to the intensity of a phase encode step. An FOV stretch factor ratio corresponds to the shift amount of a template FOV center in the PE direction.

As described above, the system control circuitry 38 according to Application Example 4 decides an FOV stretch factor and an FOV stretch factor ratio based on an object size and the PB direction. This makes it possible to set an FOV with a proper size and range without any vacant space even if there is unevenness in the amount of distortion of an object region.

Application Example 5

An FOV stretch factor ratio may be changed based on the position of an object region in a sensitivity distribution image and the PE direction. The magnetic resonance imaging apparatus 1 according to Application Example 5 will be described below.

Figure 8A:
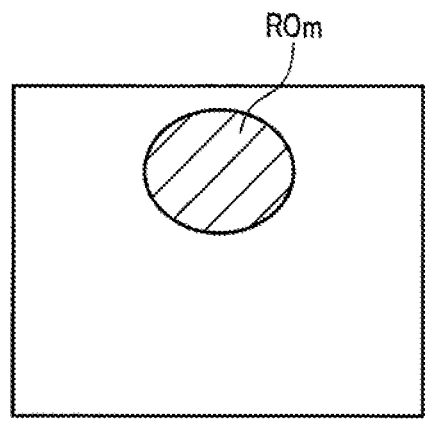
FIG. 8A is a view showing an example of changing as FOV stretch factor ratio in consideration of the position of an object region, which is performed in Application Example 5 of this embodiment, and also showing an example of a sensitivity distribution image.
Figure 8A:
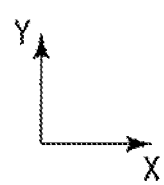
Figure 8B:
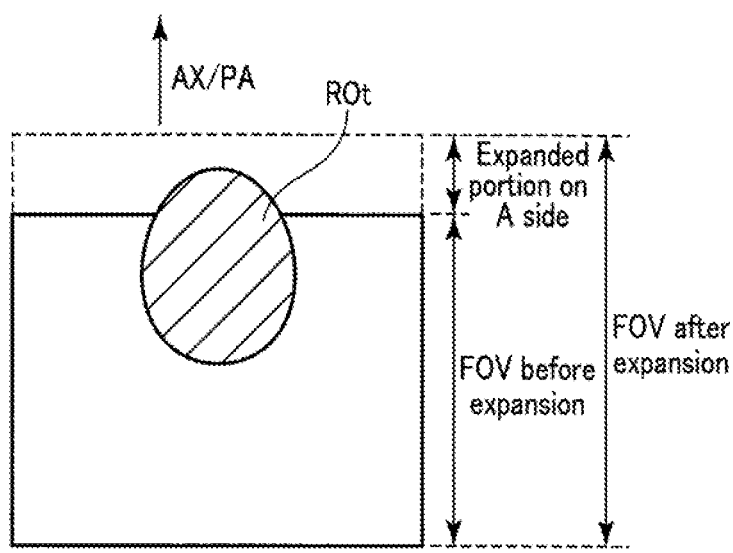
FIG. 8B is a view showing an example of changing an FOV stretch factor ratio in consideration of the position of an object region, which is performed in Application Example 5 of this embodiment, and also showing template data associated with an FOV after expansion in a case in which the PE direction is a PA direction.
Figure 8B:
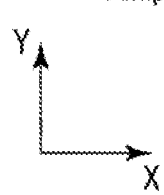
Figure 8C:
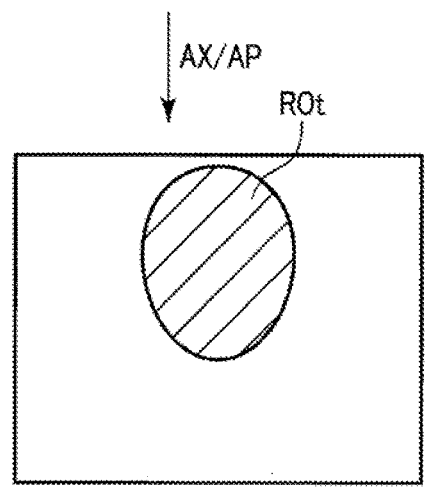
FIG. 8C is a view showing an example of changing an FOV stretch factor ratio in consideration of the position of an object region, which is performed in Application Example 5 of this embodiment, and also showing template data associated with an FOV after expansion in a case in which the PE direction is the AP direction.

FIGS. 8A, 8B, and 8C are views showing an example of changing an FOV stretch factor ratio in consideration of the position of an object region. FIG. 8A is a view showing an example of a sensitivity distribution image. FIG. 8B is a view showing template data associated with an FOV after expansion in a case in which the PE direction is the PA direction. FIG. 8C is a view showing template data associated with an FOV after expansion in a case in which the PE direction is the AP direction. Assume that, as shown in FIG. 8A, the object region ROm is located at a +Y direction side end portion (P side end portion) in the sensitivity distribution image but is not located at a −Y direction side end portion (A side end portion). In this case, when a template shot is performed upon setting the PE direction to the PA direction, the object region ROt extends from P side to A side in template data C, as shown FIG. 8B. That is, the object region may protrude on A side, but there is no fear that the object region ROt will protrude on A side. In contrast, when a template shot is performed upon setting the PB direction to the AP direction, the object region ROt extends from A side to P side in template data D, as shown in FIG. 8C. That is, there is no fear that the object region ROt will protrude on both A side and P side.

The system control circuitry 38 according to Application Example 5 changes an FOV stretch factor ratio based on the position of an object region and the PE direction. More specifically, first of all, the system control circuitry 38 specifies a direction in which the object region is likely to protrude based on the position of the object region and the PE direction. The system control circuitry 38 increases an FOV stretch factor ratio in the specified direction to a value larger than 50%, and decreases an FOV stretch factor ratio in a direction opposite to the specified direction to a value smaller than 50%. The numerical value of a ratio may be arbitrarily decided in accordance with the possibility that the object region will protrude in the opposite direction. If the possibility that the object region will protrude in the opposite direction is 0%, the FOV stretch factor ratio in the opposite direction may be decided to be 0%. As a clinical example, it is preferable to apply Application Example 5 to a case in which an imaging target is small as compared with an FOV, like a portion near the vertex of the head, and is offset to one side in the PE direction. In this case, the system control circuitry 38 preferably changes the FOV stretch factor to a smaller value or set the FOV stretch factor ratio so as to set the FOV stretch factor on the side where no imaging target exists to 0, as described above.

As described above, the system control circuitry 38 according to Application Example 5 changes an FOV stretch factor ratio based on the position of an object region in a sensitivity distribution image and the PE direction. This makes it possible to set an FOV with a proper size and range without any vacant space even if there is unevenness in the amount of distortion of the object region ROt.

Application Example 6

An FOV stretch factor ratio may be changed based on an object shape and the PE direction. The magnetic resonance imaging apparatus 1 according to Application Example 6 will be described below.

Figure 9A:
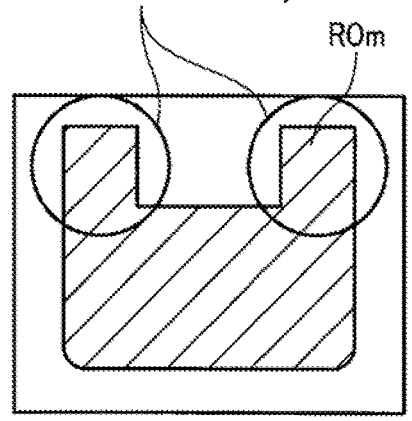
FIG. 9A is a view showing an example of changing an FOV stretch factor ratio in consideration of an object shape and the PE direction, which is performed in Application Example 6 of this embodiment, and also showing an example of a sensitivity distribution image.
Figure 9B:
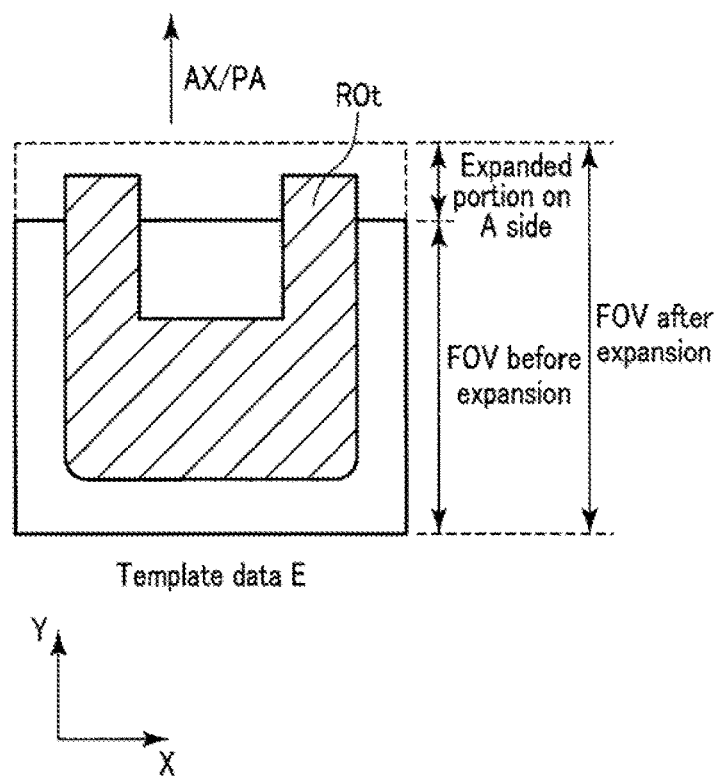
FIG. 9B is a view showing an example of changing an FOV stretch factor ratio in consideration of an object shape and the PE direction, which is performed in Application Example 6 of this embodiment, and also showing template data associated with an FOV after expansion in a case in which the PE direction is the PA direction.
Figure 9C:
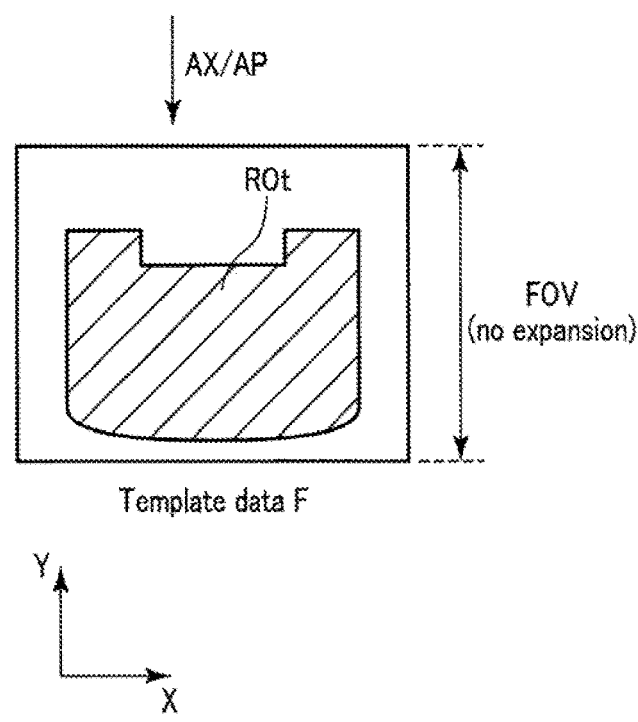
FIG. 9C is a view showing an example of changing an FOV stretch factor ratio in consideration of an object shape and the PE direction, which is performed in Application Example 6 of this embodiment, and also showing template data associated with an FOV after expansion in a case in which the PE direction is the AP direction.

FIGS. 9A, 9B, and 9C are views showing an example of changing an FOV stretch factor ratio in consideration of an object shape and the PE direction. FIG. 9A is a view showing an example of a sensitivity distribution image. FIG. 9B is a view showing template data associated with an FOV after expansion in a case in which the PE direction is the PA direction. FIG. 9C is a view showing template data associated with an FOV after expansion in a case in which the PB direction is the AP direction. As shown in FIG. 9A, assume that protruding portions susceptible to the influence of nonuniformity extend from the −Y direction side (P side) to the +Y direction side (A side). As shown in FIG. 9B, when a template shot is performed upon setting the PB direction to the PA direction, the protruding portions extend in the PA direction in template data E and protrude from the FOV of the template data E before expansion. As shown in FIG. 9C, when a template shot is performed upon setting the PE direction to the AP direction, the protruding portions contract in the PA direction in template data F and do not protrude from the FOV of the template data F before expansion.

The system control circuitry 38 according to Application Example 6 changes an FOV stretch factor ratio based on an object shape and the PE direction. More specifically, first of all, the system control circuitry 38 specifies a direction in which the object region is likely to protrude based on the object shape and the PE direction. The system control circuitry 38 increases an FOV stretch factor ratio in the specified direction to a value larger than 50%, and decreases an FOV stretch factor ratio in a direction opposite to the specified direction to a value smaller than 50%. The numerical value of a ratio may be arbitrarily decided in accordance with the possibility that the object region will protrude in the opposite direction. If the possibility that the object region will protrude in the opposite direction is 0%, the FOV stretch factor ratio in the opposite direction may be decided to be 0%.

According to the embodiment described above, the magnetic resonance imaging apparatus 1 includes at least the system control circuitry 38. The system control circuitry 38 includes the object region specifying function 381 and the parameter decision function 382. The system control circuitry 38 executes the object region specifying function 381 to specify the size of an object region in the phase encode direction which is included in a pre-image acquired by a pre-scan using a pulse sequence different from EPI. The system control circuitry 38 executes the parameter decision function 382 to decide a parameter in the phase encode direction for the FOV associated with a two-dimensional phase correction scan using EPI based on the size of an object region in the phase encode direction and the size of the FOV in the phase encode direction which is associated with a main scan using EPI.

With the above arrangement, it is possible to dynamically decide an FOV size in the PE direction in a template shot for two-dimensional phase correction using an EPI pulse sequence independently of an FOV size in the PB direction in a main scan using the EPI pulse sequence in accordance with an object size. It is therefore easy to acquire template data without any aliasing even in a template shot in which it is difficult to perform unfolding by parallel imaging. This makes it possible to improve the quality and reliability of phase correction data using template data and consequently improve image quality in a main scan.

(Modification)

In the above embodiment, the system control circuitry 38 is configured to decide an FOV stretch factor in accordance with the ratio of an object size to an FOV size in a main scan. However, this embodiment is not limited to this. The system control circuitry 38 may decide an FOV stretch factor ratio in a template shot in accordance with imaging conditions for a main scan. The magnetic resonance imaging apparatus 1 according to a modification of the embodiment will be described below.

As in the embodiment described above, distortion in EPI depends on the PE direction. Using this property, the system control circuitry 38 may decide an FOV stretch factor and an FOV stretch factor ratio based on only imaging conditions without specifying any object size. Imaging conditions associated with the modification include the above acquisition time and PE direction. That is, the system control circuitry 38 preferably decides a larger value as an FOV stretch factor as the acquisition time prolongs by using the property that as the acquisition time prolongs, the amount of distortion in EPI increases. In addition, by using the property that distortion occurs along the PE direction, the system control circuitry 38 preferably decides a large value as an FOV stretch factor when an object shape spatially changes along the PE direction. Alternatively, the system control circuitry 38 preferably decides a large value as the FOV stretch factor of an expanded portion in the direction in which an object distorts when an object shape spatially changes along the PB direction, and decides a small value or 0 as the FOV stretch factor of an expanded portion in a direction opposite to the direction in which the object distorts.

Note that when an FOV is a three-dimensional volume, an FOV stretch factor may be decided for each slice or a single FOV stretch factor may be decided for the three-dimensional volume.

As described above, the system control circuitry 38 according to this modification can decide an FOV stretch factor and an FOV stretch factor ratio based on imaging conditions. It is therefore possible to decide an FOV stretch factor and an FOV stretch factor ratio more easily than when specifying an object size.

Therefore, at least one of the embodiments described above can provide a magnetic resonance imaging apparatus which improves the quality of an image acquired by EPI.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A magnetic resonance imaging apparatus, comprising:
   processing circuitry configured to set an imaging parameter for each scan;
   imaging control circuitry configured to execute, in accordance with the imaging parameter, a first scan to acquire a first image including an object region by using a pulse sequence different from EPI, a second scan to acquire a second image including the object region by using EPI, and a phase correction scan to acquire phase correction information for the first image; and
   reconstruction circuitry configured to generate the second image by using the phase correction information,
   wherein the processing circuitry is further configured to specify a size of the object region in a phase encode direction from the first image, and set a parameter for a field of view in the phase encode direction in the phase correction scan based on a size of the field of view in the phase encode direction in the second scan and the specified size of the object region.

2. The apparatus of claim 1, wherein the first scan comprises a sensitivity distribution measurement scan associated with a reception coil.

3. The apparatus of claim 1, wherein the processing circuitry is further configured to decide, as the parameter, at least one of a size and a magnification of a field of view in the phase encode direction in the phase correction scan and a ratio between the magnification in the phase encode direction and another magnification.

4. The apparatus of claim 1, wherein the processing circuitry is further configured to decide the parameter based on a ratio between the size of the object region in the phase encode direction and the size of the field of view in the phase encode direction in the second scan.

5. The apparatus of claim 4, wherein the processing circuitry is further configured to decide the parameter based on the ratio and an acquisition time of the phase correction scan.

6. The apparatus of claim 4, wherein the processing circuitry is further configured to
   specify a shape of the object region included in the first image, and
   decide the parameter based on a shape of the object region and the ratio.

7. The apparatus of claim 4, wherein the processing circuitry is further configured to decide the parameter based on the first image and the ratio.

8. The apparatus of claim 4, wherein the processing circuitry is further configured to decide the parameter based on a shimming image acquired by a scan for active shimming and the ratio.

9. The apparatus of claim 1, further comprising:
   a static field magnet configured to apply a static magnetic field;
   a gradient coil configured to apply a gradient magnetic field;
   transmission circuitry configured to transmit a high frequency magnetic field to an object; and
   reception circuitry configured to receive an MR signal from the object,
   wherein the imaging control circuitry controls the gradient coil, the transmission circuitry, and the reception circuitry to execute the phase correction scan in accordance with the parameter.

10. The apparatus of claim 1, wherein the processing circuitry is further configured to set the parameter for each slice when the second scan comprises a multi slice scan.

11. A magnetic resonance imaging apparatus, comprising:
    processing circuitry configured to specify a size of an object region in a phase encode direction which is included in an image acquired by a first scan using a pulse sequence different from EPI and decide a parameter for a field of view in the phase encode direction which is associated with a two dimensional phase correction scan using EPI based on a size of the field of view in the phase encode direction which is associated with a second scan using EPI and the specified size of the object region.

* * * * *